United States Patent [19]

Blalock

[11] Patent Number: 5,417,826
[45] Date of Patent: May 23, 1995

[54] REMOVAL OF CARBON-BASED POLYMER RESIDUES WITH OZONE, USEFUL IN THE CLEANING OF PLASMA REACTORS

[75] Inventor: Guy T. Blalock, Boise, Id.

[73] Assignee: Micron Technology, Inc., Boise, Id.

[21] Appl. No.: 898,622

[22] Filed: Jun. 15, 1992

[51] Int. Cl.⁶ .............................................. H05H 1/24
[52] U.S. Cl. .............................. 204/176; 204/157.15; 422/186.04; 422/186.05; 422/906; 110/236; 134/1
[58] Field of Search .............. 422/186, 186.04, 186.05, 422/906; 110/236; 201/2; 204/176, 157.15; 134/1; 156/643

[56] References Cited

U.S. PATENT DOCUMENTS

| | | | |
|---|---|---|---|
| 4,341,592 | 7/1982 | Shortes et al. | 156/643 |
| 4,721,664 | 1/1988 | Shimizu et al. | 430/12.8 |
| 4,820,377 | 4/1989 | Davis et al. | 156/643 |
| 4,854,263 | 8/1989 | Chang et al. | 118/715 |
| 4,859,304 | 8/1989 | Cathey et al. | 204/298 |
| 4,872,947 | 10/1989 | Wang et al. | 156/643 |
| 4,885,047 | 12/1989 | Ury et al. | 156/345 |
| 4,892,753 | 1/1990 | Wang et al. | 427/38 |
| 4,960,488 | 10/1990 | Law et al. | 156/643 |
| 5,044,314 | 9/1991 | McNeilly | 118/715 |
| 5,158,644 | 10/1992 | Cheung et al. | 156/643 |
| 5,215,592 | 1/1993 | Jackson | 134/1 |
| 5,261,966 | 11/1993 | Mashimo et al. | 134/2 |
| 5,281,302 | 1/1994 | Gabric et al. | 156/643 |
| 5,356,478 | 10/1994 | Chen et al. | 134/1 |

FOREIGN PATENT DOCUMENTS

| | | | |
|---|---|---|---|
| 2341216C2 | 11/1985 | Germany | C23G 5/00 |
| 59-50179A | 7/1984 | Japan | C23F 1/00 |
| 60-32322A | 2/1985 | Japan | H01L 21/302 |
| 61-123143A | 6/1986 | Japan | H01L 21/302 |
| 61-250185A | 11/1986 | Japan | H01L 21/302 |
| 63-228620A | 9/1988 | Japan | H01L 21/30 |
| 3-82782A | 6/1991 | Japan | C23F 4/00 |
| 4-75324A | 3/1992 | Japan | H01K 21/027 |
| 4-83340A | 3/1992 | Japan | H01L 21/304 |

OTHER PUBLICATIONS

Daniel L. Flamm, Dry Plasma Resist Stripping Part I: Overview of Equuipment, Solid State Technology, Aug. 1992, pp. 37–39.

Primary Examiner—Donald P. Walsh
Assistant Examiner—Daniel Jenkins
Attorney, Agent, or Firm—Lia M. Pappas

[57] ABSTRACT

A method for removing carbon-based polymer residues to effect a cleaning of a reactor, such as a planar plasma reactor, by exciting an ozone containing atmosphere in the reactor, which atmosphere is reactive with the carbon-based residues thereby forming volatile end products, which end products can be evacuated from the reactor.

19 Claims, 2 Drawing Sheets

REMOVAL OF CARBON-BASED POLYMER RESIDUES WITH OZONE, USEFUL IN THE CLEANING OF PLASMA REACTORS

FIELD OF THE INVENTION

This invention relates to semiconductor equipment maintenance, and more particularly, to the cleaning of equipment by the removal of carbon-based polymer residues from vacuum chambers. The invention has use in other types of vacuum chambers and in other equipment which may be subject to the deposition of carbon-based polymer residues.

BACKGROUND OF THE INVENTION

Plasma dry etch machines on reactors are vacuum chambers in which an electrical plasma is created in order to etch semiconductor wafers. The etching is usually performed through a photoresist mask. Quite often it is desired to etch oxide layers preferentially over adjacent polysilicon such as the wafer substrate.

The dry etching of certain films (e.g., silicon dioxide) used in semiconductor manufacturing involves the use of fluorocarbon containing gases to effect good selectivity to the silicon or silicon nitride substrates typically used in the fabrication process. One of the most notable examples of a dry etch is the high aspect silicon dioxide contact etch.

In the dry etch process, a wafer is placed over a metallic cathode plate and plasma is discharged to flow from a cathode to the anode plate, where the wafer functions as the cathode.

During the processing of high aspect contacts, a $CF_4$ +$CHF_3$ chemistry is used to effect a high etch rate, while at the same time maintaining sufficient selectivity to the silicon substrate. The contact etch is achieved by the selective deposition of the carbon/fluoride based fluorocarbon polymers onto surfaces which are not to be etched. As a result of this process, the fluorocarbon polymers become deposited on grounded portions of the reactor surface. Similarly, in the other etching processes, a fluorocarbon polymer is applied to the wafer in order to cause the preferential etching of the silicon dioxide over silicon. For example, etching of silicon dioxide in a planar system takes place in $C_2F_6$, which provides good selectivity when etching silicon dioxide over silicon substrates. Selectivity is a major consideration of plasma etching processes.

In order to obtain the desired contact profile and substrate selectivities, the carbon/fluoride ratio must be optimized. In most cases, the optimum carbon/fluoride ratio for contact etching results in a heavy fluorocarbon polymer deposition process for the dry etch reactor grounded anode. The resulting thick polymer directly effects the particle performance of the process, and consequently, the process stability over time.

The polymer buildup tends to occur around the outer perimeter of the anode outside of the area where the wafer is resting, and this buildup interferes with the etching process. The fluoropolymer tends to become deposited upon cooler surfaces and grounded or non-powered surfaces, such as the anode plate.

When there is a large build up of fluorocarbons in the chamber, there is greater opportunity for contamination of the wafers. The deposition necessitates the removal of the anode plate for cleaning after a given number of wafers typically 500–800 wafers. The removal for cleaning results in equipment downtime for the plasma dry etch machine because of the difficulty in removing and replacing the anode plate. As a result, manual cleaning is very time consuming and greatly hinders the manufacturing process. The polymer film deposition problem is essentially the greatest limiting factor of wafer throughput per chamber clean for most such selective oxide etches. U.S. Pat. No. 4,859,304 entitled "Temperature Controlled Anode for Plasma Dry Etchers for Etching Semiconductor," describes some of the problems associated with fluoropolymer residues.

Presently, dry etch cleaning schemes using oxygen are utilized to handle the problem of fluorocarbon residue removal. Oxygen is currently being used for plasma dry cleaning. The removal of the fluorocarbon polymer is effected by the elemental oxygen produced by plasma ionization. The amount of elemental oxygen produced is proportional to the ionization efficiency of the plasma source. For most of the typical etch tools, the ionization efficiency is on the order of 0.01% to 0.1%.

The present invention increases the amount of elemental oxygen present during the cleaning process, using ozone in lieu of oxygen. Ozone is currently being used for plasma oxide deposition and wet cleaning, processes which are significantly different from the use of ozone for a dry chamber clean. In the presence of sufficient heat, ozone decomposes to form oxygen and a free radical. The decomposition of the ozone could be driven by plasma excitation. The actual weight percentage of ozone injected into the reactor via an ozone generator is approximately 4.2%. Based on this figure, the use of ozone in place of oxygen would result in two to three orders of magnitude more elemental oxygen for reaction with the fluorocarbon polymer residue.

SUMMARY OF THE INVENTION

In accordance with the present invention ozone is used to effect cleaning of a dry etch or other chamber by removal of carbon-based polymer residues from the chamber. The carbon-based residue removal occurs at a rate which is significantly greater than the rate of methods presently employed to effect the chamber cleaning.

One advantage of the present invention is the more efficient production of elemental oxygen to effect the dry etch cleaning of carbon-based polymer residues within the etch chamber. As a result, less time is involved in the cleaning of the chamber, and consequently, production is able to be quickly resumed.

Another advantage of the present invention is the enhanced dry clean performance which has a tremendous positive impact on the production worthiness of any high aspect ratio contact etch process. The present invention minimizes the downtime in the manufacturing process.

BRIEF DESCRIPTION OF THE DRAWINGS

The present invention will be better understood from reading the following description of nonlimitative embodiments, with reference to the attached drawings, wherein.

DETAILED DESCRIPTION OF THE INVENTION

Figure 1:
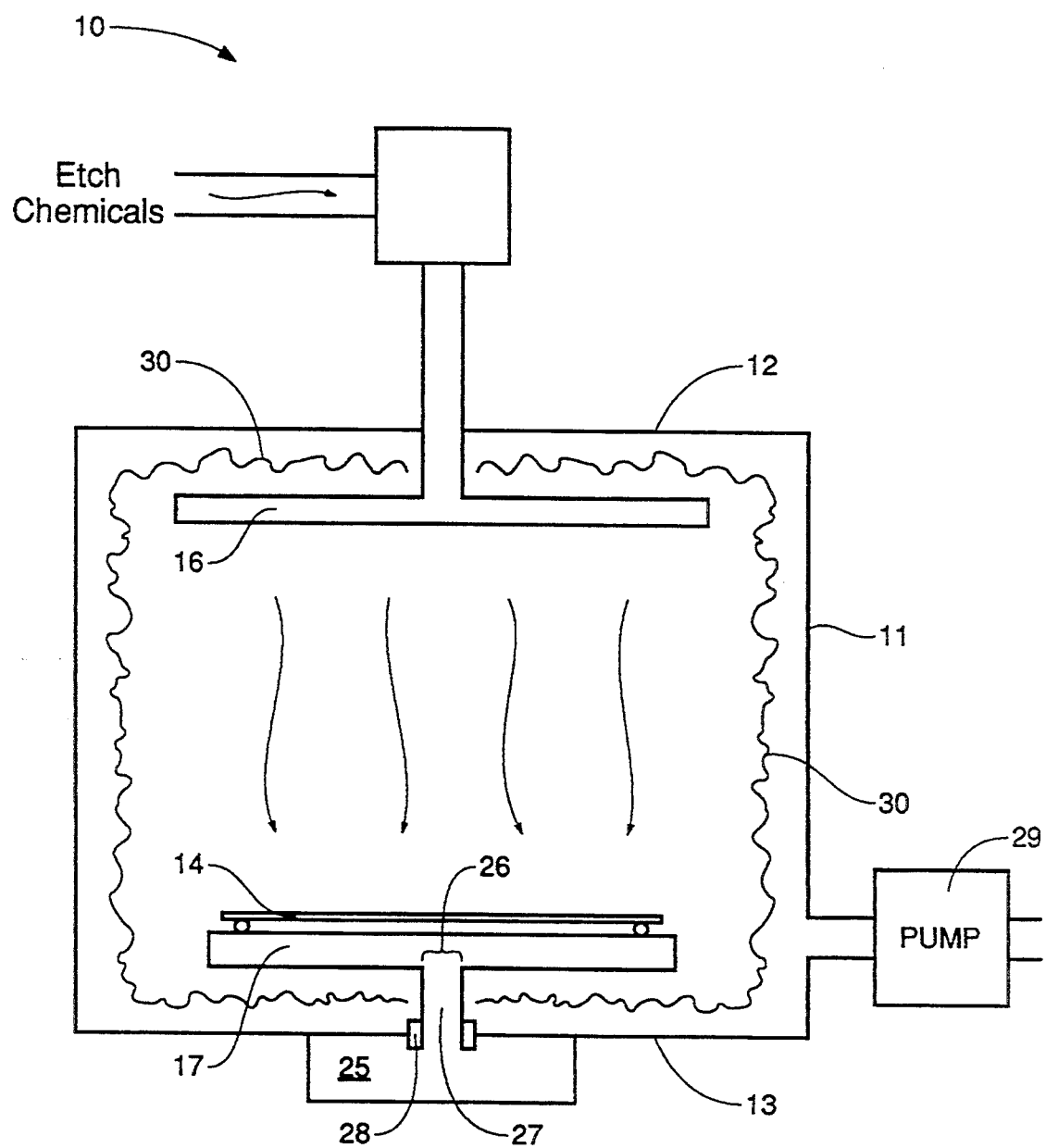
FIG. 1 is a partial cross-sectional schematic drawing of a planar dry etch apparatus prior to chamber cleaning.

Referring to FIG. 1, a plasma dry etch chamber is shown in which fluorocarbon gases can be used to perform a selective etch of silicon dioxide to silicon or silicon nitride, for example. FIG. 1 is a partial cross-sectional view of a typical plasma etching chamber, generally indicated by the numeral 10. The chamber 10 is comprised of a hollow, cylindrical member 11 having upper and lower end plates 12 and 13, respectively. A pair of cylindrical, spaced apart, disc-shaped top and bottom electrodes 16 and 17, respectively, are positioned within the chamber 10. The bottom electrode 17, which can be made of aluminum or the like, has a central aperture 26 and is fixedly connected to a hollow metal pipe 27 which is insulated from the lower end plate 13 by a hermetic bushing 28. The lower end of pipe 27 is connected to an radio frequency (RF) power source 25. A vacuum pump 29 serves to maintain a vacuum within chamber 10 and also to remove spent gases therein. The polymer residue is designated by the numeral 30. The amount of film 30 present has been exaggerated for ease of illustration.

For purposes of this application, and for ease of discussion electrode 16 will be referred to as an anode, and electrode 17 will be referred to as a cathode. It would be understood by one skilled in the art that the anode need not be the top electrode and vice versa.

The preferred embodiment involves in situ cleaning method using etching gases in the chamber 10 that are activated by a plasma field created in the chamber 10. The plasma field is created by a radio frequency (RF) electric field at 25. This type of cleaning is applicable to tube furnaces used for chemical vapor deposition processes, where the buildup of reaction-created particles is greater than in oxidation processes, as well as plasma etch and plasma chemical vapor deposition processes.

An alternative method involves in situ chamber cleaning with a portable plasma generator. The plasma generator is positioned inside the chamber where it activates etching gases passed into the chamber. The gases etch away contaminants.

When it is determined that the polymer film 30 has become thick enough on the chamber hardware to produce particle contamination in excess of prescribed standards, all wafers are removed from the system. The process chamber 10 is evacuated of the standard process gases which are in the chamber. A dummy wafer 14 is positioned in the reactor to protect delicate hardware (such as the backside cooling apparatus) during the clean cycle.

The process gases that are associated with the cleaning cycle are then applied to the reactor 10 through the anode electrode 16. The direction of the gas flow is indicated by the arrows. The radio frequency (RF) power 25 is then applied to the chamber to excite the ozone-containing reactive species (i.e., the cleaning gases). The ozone plasma reacts with the fluorocarbon polymer 30 on the chamber surfaces 11, 12, 13, 16, 17, thereby forming a volatile residue. The reactive gases and volatile residues are then pumped out of the reactor through a mechanical pump 29.

The cleaning process is related to the amount of residue 30 present in the chamber 10, and is usually in the range of 15–30 minutes. The cleaning intervals are set based on the particle specifications, which specifications would be known by one having ordinary skill in the art.

In the preferred embodiment a two step process is utilized. The first step consists of a low pressure step with a pressure range of 100–500 mTorr. This step is used for concentrating the cleaning on the powered electrode (i.e., the cathode 13).

The second process step consists of a high pressure region in order to effect efficient cleaning of the grounded reactor components, such as the side walls and anode. The preferred range is 500 mTorr—10 Torr, with 1000 mTorr being the preferred pressure.

The other process parameters are substantially the same for the low pressure and high pressure steps. The ozone flow is usually in the range of 50–500 sccm, which range is based on current availability of ozone from an ozone generator. The currently preferred concentration of incoming ozone is approximately 1–4% by molecular weight of total gas flow through the reactor 10. Of course, the highest concentration ozone available for the process is desired. Addition of a fluorine-containing species, such as $NF_3$ or $CF_4$, has been found to enhance removal of the carbon-based residues. The preferred range of such fluorine-based additives is 10–100 sccm. The preferred power to the system is in the range of 1–5 watts/cm$^2$ at a radio frequency (RF) of 13.56 MHz.

Figure 2:
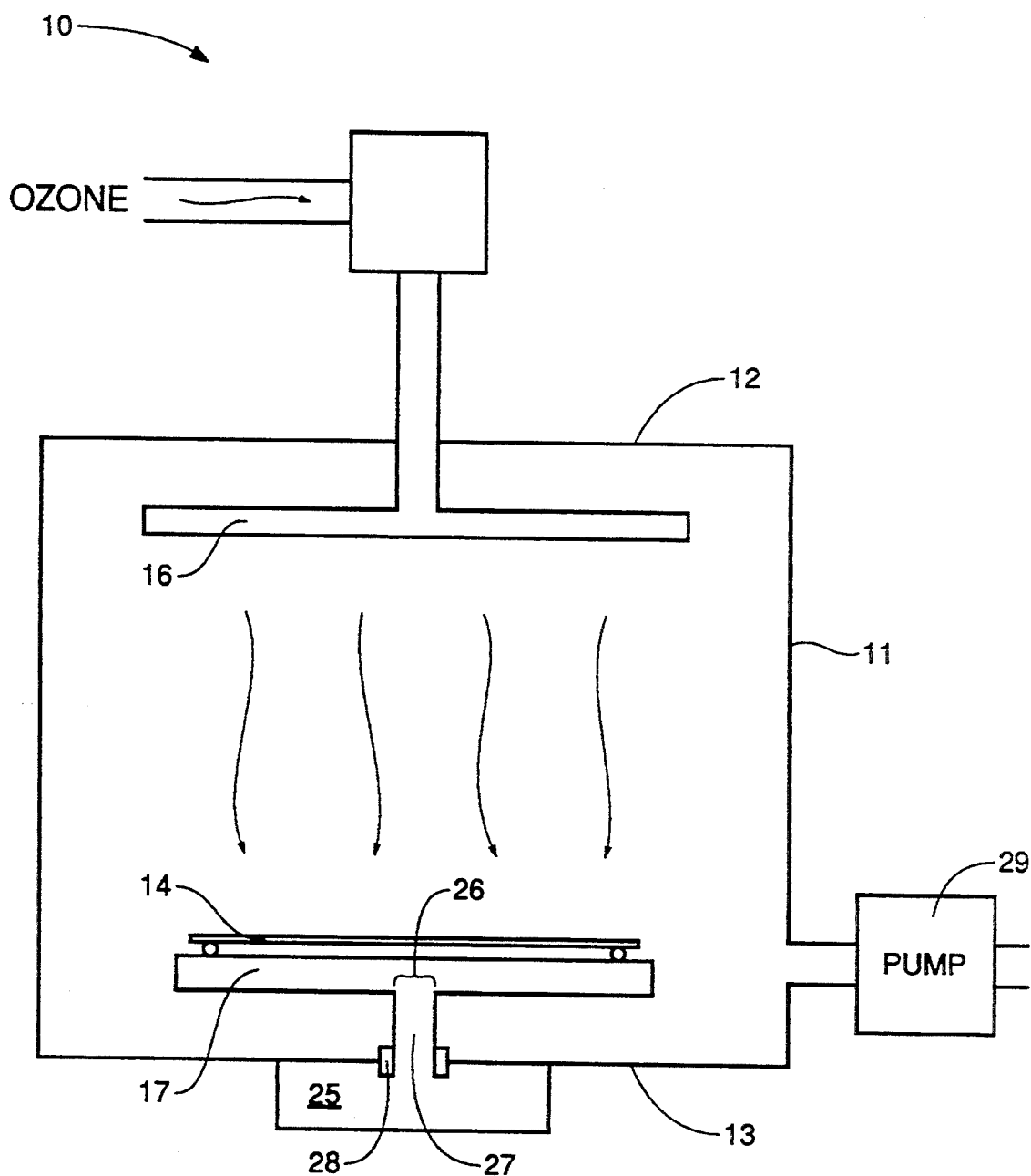
FIG. 2 is a partial cross-sectional schematic drawing of a planar dry etch apparatus subsequent to chamber cleaning according to the process of the present invention.

In both embodiments, ozone gas is pumped into the chamber 10 in the form of a plasma where upon the elemental oxygen reacts with the fluoropolymer residues. The end products are then evacuated from the chamber 10 via a mechanical pump assembly 29. FIG. 2 illustrates the appearance of the chamber 10 after the residue 30 has been removed.

The chemical reactions are described below:

(A) $O_2 \rightarrow O + O$ (B) $O_3 \rightarrow O_2 + O$ (C) $O$ + carbon-based polymer $\rightarrow CO + CO_2$ + other volatile end products Reaction (A) depicts the breakdown of an oxygen molecule into two separate oxygen atoms (also referred to as elemental oxygen). Oxygen atoms are highly reactive and it is difficult to prevent the oxygen atoms from recombining. The amount of elemental oxygen produced is proportional to the ionization efficiency of the plasma source. For most of the typical etch tools, the ionization efficiency is on the order of 0.01% to 0.1%.

Reaction (B) depicts the breakdown of an ozone molecule into one molecule of oxygen and one free radical of oxygen. In the presence of sufficient heat ozone decomposes to form the oxygen molecule and the free radical. The decomposition of the ozone could be driven by plasma excitation. The actual weight percentage of ozone injected into the reactor via an ozone generator is approximately 4.2%.

Reaction (C) depicts the chemical reaction which occurs in the cleaning process between the free radical oxygen and a carbon-based polymer.

All of the U.S. patents and patent applications cited herein are hereby incorporated by reference herein as if set forth in their entirety.

While the particular method for fluorocarbon polymer residue as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, although the preferred embodiment is described with reference to fluorocarbons in a silicon dioxide etch, one with ordinary skill in the art would understand that the present invention could be applied to other chambers upon which are deposited carbon-based polymer residues, such as chloro-carbon residues. Further, there is a wide latitude with regard to the structural elements which can be used in the plasma reactor.

I claim:

1. A process for removing carbon-based residues from surfaces of a reactor, the process comprising the following steps of:
   introducing a flow of gases comprising ozone into the reactor, which ionizes in an RF electric field to form oxygen molecules and elemental oxygen, wherein said ozone is generated from oxygen in a concentration of approximately 1–4 percent by molecular weight of total gas flow through the reactor;
   exciting an atmosphere by establishing an RF electric field to form a plasma in the reactor, said ozone containing plasma being reactive with the carbon-based residues on the surface of the reactor, thereby forming volatile end products;
   evaluating said volatile end products from the reactor.

2. The process according to claim 1, wherein said ozone is provided into the reactor at approximately 50–500 sccm.

3. The process according to claim 2, wherein the carbon-based residue is a fluorocarbon residue.

4. The process according to claim 3, wherein the process is performed by said establishment of an RF electric field to form a plasma in the reactor for approximately 15–30 minutes.

5. The process according to claim 4, further comprising enhancing said plasma further with fluorine containing gas.

6. A process for cleaning a reaction chamber, said process comprising the steps of:
   providing a first atmosphere in the reaction chamber by introducing gases, said first atmosphere containing ozone;
   exciting said first atmosphere to form a first plasma, said first plasma for cleaning the reaction chamber thereby creating a flowable residue;
   increasing pressure on said first atmosphere thereby creating a second atmosphere;
   exciting said second atmosphere to form a second plasma, said second plasma for further cleaning the reaction chamber thereby creating more of said flowable residue; and
   removing said flowable residue from the reaction chamber through a pump.

7. The process according to claim 6, wherein said first atmosphere has a pressure within approximately 100–500 mTorr, with a power density of plasma of approximately 1–5 W/cm$^2$.

8. The process according to claim 7, wherein said second atmosphere has a pressure within approximately 500 mTorr to 10 Torr, with a power density of plasma of approximately 1–5 W/cm$^2$.

9. The process according to claim 8, wherein said ozone is provided at a flow of approximately 50–500 sccm.

10. The process according to claim 9, wherein said ozone is generated from oxygen, said ozone comprising approximately 1–4% by molecular weight of total gas flow through the reactor.

11. The process according to claim 10, wherein said first atmosphere and said second atmosphere are excited at a radio frequency (RF) of approximately 13.56 MHz.

12. The process according to claim 11, wherein said reactor has a power electrode, said first atmosphere being for cleaning said power electrode.

13. The process according to claim 12, wherein said reactor has grounded components, said second atmosphere being for cleaning of said grounded components.

14. A method for cleaning a planar plasma reactor chamber, comprising the following steps:
   providing a plasma etch reactor, said reactor having an interior and an exterior, said interior of said reactor being covered with a residue, said residue being a carbon-based polymer;
   introducing a flow of gases into the reactor, said flow consisting of a mixture of oxygen and ozone and at least one of NF$_3$ and CF$_4$ into the planar plasma reactor, thereby creating an atmosphere;
   exciting a plasma in said atmosphere, said plasma being reactive, said plasma reacting with said carbon-based polymer to form volatile end products; and
   evacuating said interior of said reactor.

15. The method according to claim 14, wherein said atmosphere is excited by an RF electric field, said RF electric field being approximately 13.56 MHz.

16. The method according to claim 15, wherein said at least one of NF$_3$ and CF$_4$ are flowed into said reactor at approximately 10–100 sccm.

17. The method according to claim 16, wherein said ozone is flowed into said reactor at approximately 50–500 sccm.

18. The method according to claim 17, wherein said ozone comprises approximately 1–4 percent by molecular weight of total gas flow through the reactor.

19. The method according to claim 18, wherein said ozone ionizes in said RF electric field to form O$_2$ and O$^-$, said O$^-$ reacting with said carbon-based polymer thereby forming said volatile residue.

* * * * *